(12) United States Patent
Tseng et al.

(10) Patent No.: US 9,257,463 B2
(45) Date of Patent: Feb. 9, 2016

(54) SELF-ALIGNED IMPLANTATION PROCESS FOR FORMING JUNCTION ISOLATION REGIONS

(75) Inventors: Chien-Hsien Tseng, Hsin-Chu (TW); Shou-Gwo Wuu, Hsin-Chu (TW); Chia-Chan Chen, Zhubei (TW); Kuo-Yu Wu, Zhubei (TW); Dao-Hong Yang, Xihu Township (TW); Ming-Hao Chung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 185 days.

(21) Appl. No.: 13/588,879

(22) Filed: Aug. 17, 2012

(65) Prior Publication Data

US 2013/0320418 A1 Dec. 5, 2013

Related U.S. Application Data

(60) Provisional application No. 61/653,854, filed on May 31, 2012.

(51) Int. Cl.
*H01L 21/336* (2006.01)
*H01L 27/146* (2006.01)

(52) U.S. Cl.
CPC ...... *H01L 27/14603* (2013.01); *H01L 27/1461* (2013.01); *H01L 27/1463* (2013.01); *H01L 27/14609* (2013.01); *H01L 27/14612* (2013.01)

(58) Field of Classification Search
USPC .................. 257/290–292, 505, 544
IPC .................. H01L 27/14609
See application file for complete search history.

(56) References Cited

U.S. PATENT DOCUMENTS

| 5,528,059 | A | 6/1996 | Isogai | |
|---|---|---|---|---|
| 6,512,280 | B2 * | 1/2003 | Chen et al. | 257/465 |
| 6,844,597 | B2 * | 1/2005 | Baird et al. | 257/355 |
| 6,870,209 | B2 | 3/2005 | Dosluoglu et al. | |
| 6,878,568 | B1 * | 4/2005 | Rhodes et al. | 438/73 |
| 7,148,528 | B2 * | 12/2006 | Rhodes | 257/292 |
| 7,297,603 | B2 * | 11/2007 | Robb et al. | 438/289 |
| 7,391,066 | B2 * | 6/2008 | Rhodes | 257/239 |
| 7,915,652 | B2 * | 3/2011 | Lee et al. | 257/291 |
| 8,115,242 | B2 * | 2/2012 | Merrill | 257/292 |
| 8,339,494 | B1 * | 12/2012 | McCarten et al. | 348/294 |
| 8,716,768 | B2 * | 5/2014 | Lyu et al. | 257/291 |
| 8,928,792 | B1 * | 1/2015 | Hynecek et al. | 348/308 |
| 2008/0272408 | A1 * | 11/2008 | Vora | 257/272 |
| 2011/0180689 | A1 * | 7/2011 | Roy et al. | 250/208.1 |
| 2011/0267505 | A1 * | 11/2011 | Dierickx | 348/241 |

FOREIGN PATENT DOCUMENTS

| JP | H7153988 | 5/1995 |
|---|---|---|
| KR | 1020040064237 | 7/2004 |
| KR | 1020060010906 | 2/2006 |

* cited by examiner

*Primary Examiner* — Eugene Lee
(74) *Attorney, Agent, or Firm* — Slater & Matsil, L.L.P.

(57) ABSTRACT

A device includes a semiconductor substrate, a well region in the semiconductor substrate, and a Metal-Oxide-Semiconductor (MOS) device. The MOS device includes a gate dielectric overlapping the well region, a gate electrode over the gate dielectric, and a source/drain region in the well region. The source/drain region and the well region are of opposite conductivity types. An edge of the first source drain region facing away from the gate electrode is in contact with the well region to form a junction isolation.

20 Claims, 11 Drawing Sheets

SELF-ALIGNED IMPLANTATION PROCESS FOR FORMING JUNCTION ISOLATION REGIONS

This application claims the benefit of the following provisionally filed U.S. Patent application Ser. No. 61/653,854, filed May 31, 2012, and entitled "Self-Aligned Implant Process;" which application is hereby incorporated herein by reference.

BACKGROUND

In the manufacturing of integrated circuits, the sizes of integrated circuit devices are scaled down increasingly. For example, Complementary Metal-Oxide-Semiconductor (CMOS) Image Sensor (CIS) chips have increasingly smaller pixel sizes. Accordingly, the requirement in the DC and noise performance of the CIS chips becomes increasingly stricter. Conventional circuit formation processes thus cannot meet the strict requirements of the CIS chips. For example, Shallow Trench Isolation (STI) regions were used to isolate devices. In the formation of the STI regions, the silicon substrate, in which the STI regions are formed, suffers from damage caused by the formation of the STI regions. As a result, charges such as electrons are trapped at the interfaces between the STI regions and the silicon substrate. These charges cause background noise in the signals of the CIS chips.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method of forming a Metal-Oxide-Semiconductor (MOS) device and the respective junction isolation is provided in accordance with various exemplary embodiments. The intermediate stages of forming the MOS device are illustrated. Variations of the embodiments are discussed. Throughout the various views and illustrative embodiments, like reference numbers are used to designate like elements.

Figure 1:
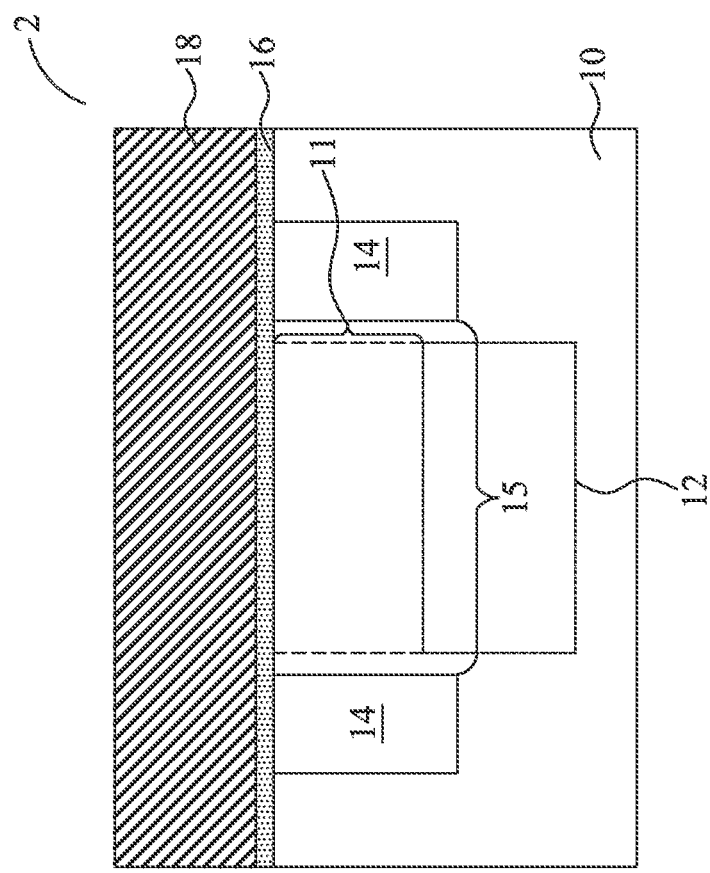
FIGS. 1 through 6 are cross-sectional views and top views of intermediate stages in the manufacturing of a Metal-Oxide-Semiconductor (MOS) device in an image sensor chip in accordance with some exemplary embodiments.

Referring to FIG. 1, wafer 2, which includes semiconductor substrate 10, is provided. In some embodiments, semiconductor substrate 10 is a silicon substrate. In alternative embodiments, semiconductor substrate 10 is formed of other semiconductor materials such as silicon carbon, silicon germanium, III-V compound semiconductor materials, or the like. Semiconductor substrate 10 may also be a Silicon-On-Insulator (SOI) substrate. Deep well region 12 is formed in semiconductor substrate 10, for example, through implanting a p-type or an n-type impurity into semiconductor substrate 10. Deep well region 12 may extend from the top surface of semiconductor substrate 10 into semiconductor substrate 10. Alternatively, deep well region 12 may be buried in semiconductor substrate 10, wherein surface layer 11 of semiconductor substrate 10, which surface layer 11 overlaps deep well region 12, is not doped with the impurity of deep well region 12 when deep well region 12 is formed. Deep well region 12 may be formed through implantation. Alternatively, deep well region 12 is formed through epitaxy growth, with the respective impurity in-situ doped during the epitaxy growth. In some exemplary embodiments, deep well region 12 has a p-type or n-type impurity concentration between about $5 \times 10^{15}/cm^3$ and about $5 \times 10^{16}/cm^3$. It is appreciated that the dimensions recited throughout the description are merely examples, and may be changed to different values.

Image sensors 14 are formed adjacent to deep well region 12. In some embodiments, image sensors 14 are disposed on opposite sides of deep well region 12. Image sensors 14 may be photo diodes or photo transistors, for example. The portion 15 of the semiconductor substrate 10 between neighboring image sensors 14 may not include any insulation region such as a Shallow Trench Isolation (STI) region therein.

Gate dielectric layer 16 and gate electrode layer 18 are formed over semiconductor substrate 10. Gate dielectric layer 16 may include an oxide, a nitride, an oxynitride, a carbide, combinations thereof, and/or multi-layers thereof. Gate electrode layer 18 is conductive or semi-conductive, and may be formed of polysilicon. Alternatively, gate electrode layer 18 is formed of other conductive materials such as metals, metal silicides, metal nitrides, and combinations thereof.

Figure 2:
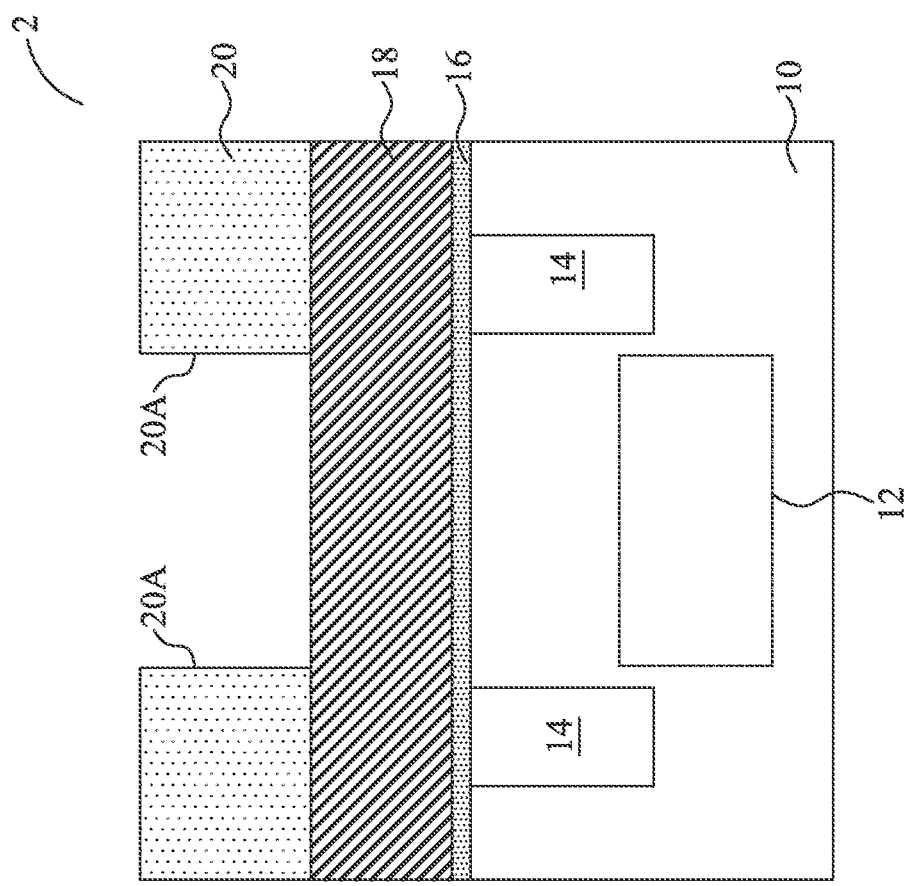

Referring to FIG. 2, hard mask 20 is formed over gate electrode layer 18. In some embodiments, hard mask 20 comprises silicon nitride. In alternative embodiments, hard mask 20 is formed of another dielectric material such as silicon oxynitride (SiON), silicon carbide, or silicon oxide. Hard mask 20 is patterned, and a portion of hard mask 20 that overlaps deep well region 12 is removed. The remaining hard mask 20 includes portions that overlap image sensors 14.

Figure 3:
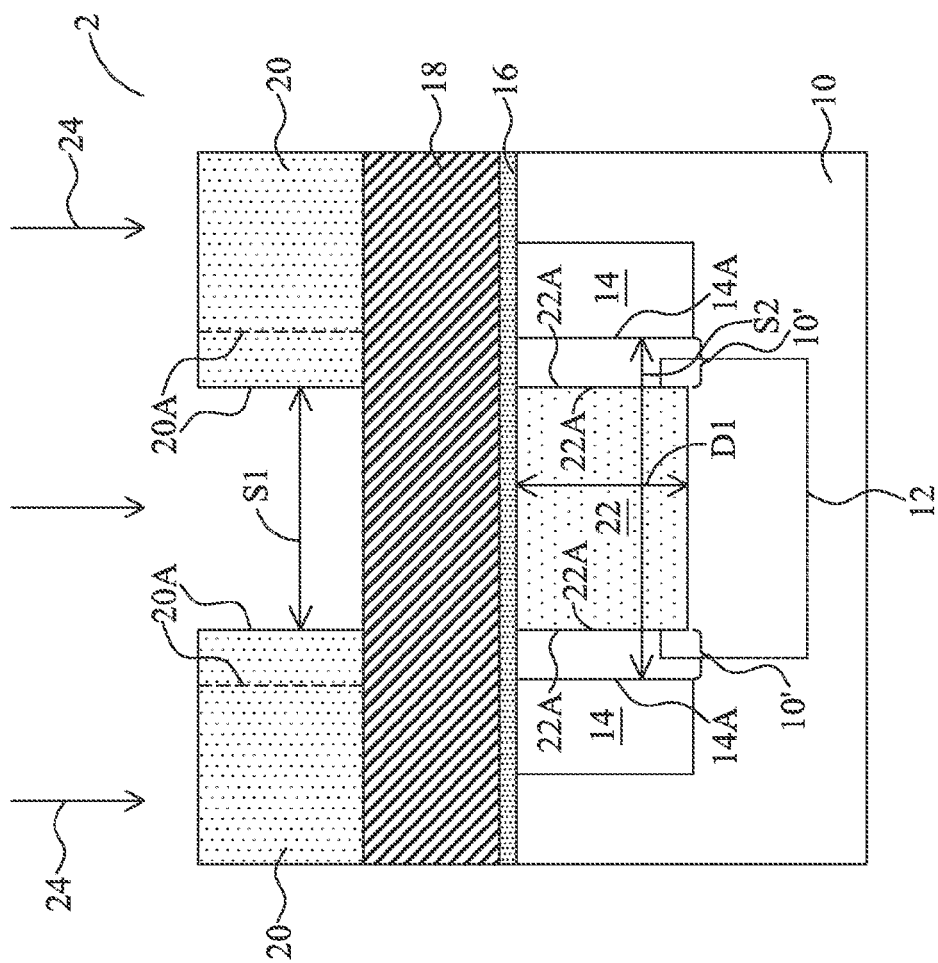

Next, as shown in FIG. 3, well region 22 is formed in semiconductor substrate 10 through the implantation of a p-type or n-type impurity, wherein hard mask 20 is used as an implantation mask. The conductivity type of well region 22 is the same as the conductivity type of deep well region 12. The impurity concentration of well region 22 may be between about $10^{16}/cm^3$ and about $10^{17}/cm^3$. The implantation (symbolized by arrows 24) is performed using an energy high enough for the implanted impurity to penetrate through gate electrode layer 18 and gate dielectric layer 16. In some embodiments, the implanted impurity is a p-type impurity that, for example, comprises boron, indium, and/or the like. In alternative embodiments, the implanted impurity is an n-type impurity, for example, comprising phosphorous, arsenic, antimony, and/or the like.

Figure 3A:
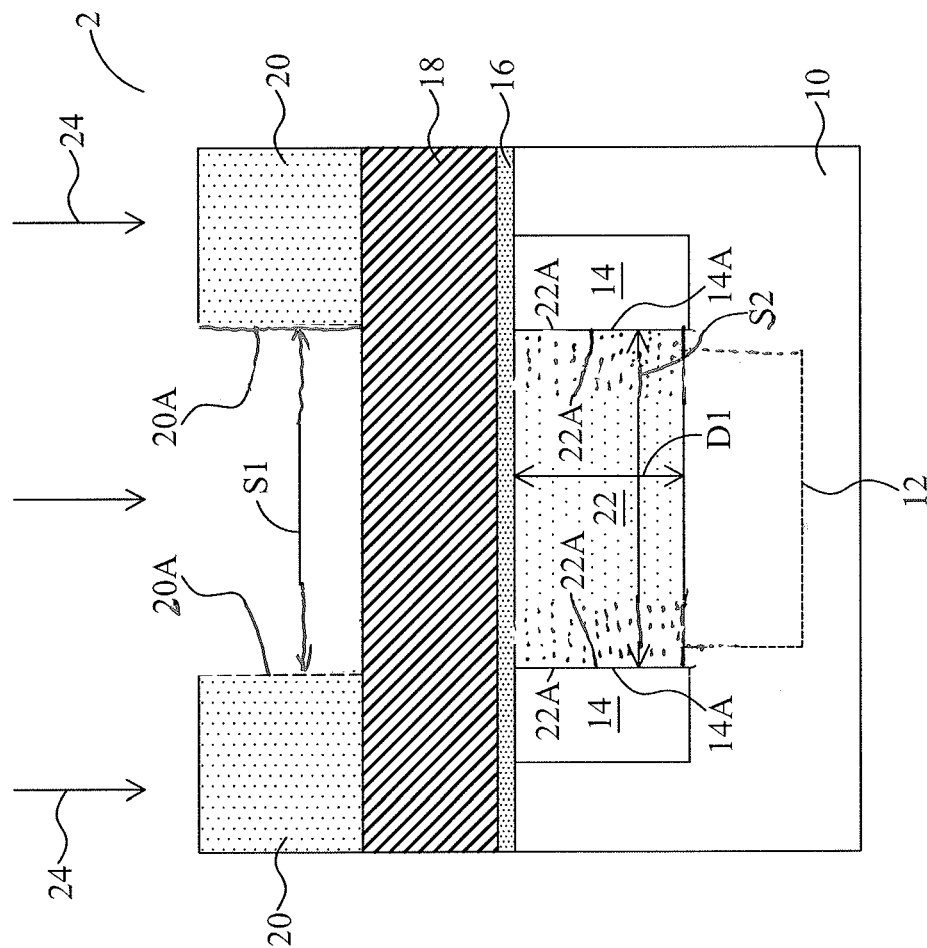

In some embodiments, edges 20A of hard mask 20 are misaligned with edges 14A of image sensors 14. Furthermore, spacing S1 between opposite sidewalls 20A may be smaller than spacing S2 between edges 14A of image sensors 14. As a result, after the subsequent thermal budget, edges 22A of well region 22 may be spaced apart from edges 14A of image sensors 14. The portions 10' of semiconductor substrate 10, which portions separate well region 22 from the nearest image sensors 14, may be lightly doped (for example, having an impurity concentration lower than about $10^{15}/cm^3$). Furthermore, portions 10' may have a conductivity type the same as the conductivity type of well region 22 and deep well region 12. In alternative embodiments, edges 20A (illustrated using dashed lines) of hard mask 20 are aligned to edges 14A of image sensors 14. As a result, edges 22A of well region 22 are in contact with edges 14A of image sensors 14, as shown in FIG. 3A. The depth D1 of well region 22 may be between about 100 nm and about 1 μm, for example. After the implantation, hard mask 20 is removed. In the resulting structure, no dielectric isolation regions such as STI regions are formed in semiconductor substrate 10 and between well region 22 and its neighboring image sensors 14 in accordance with some exemplary embodiments.

Figure 4A:
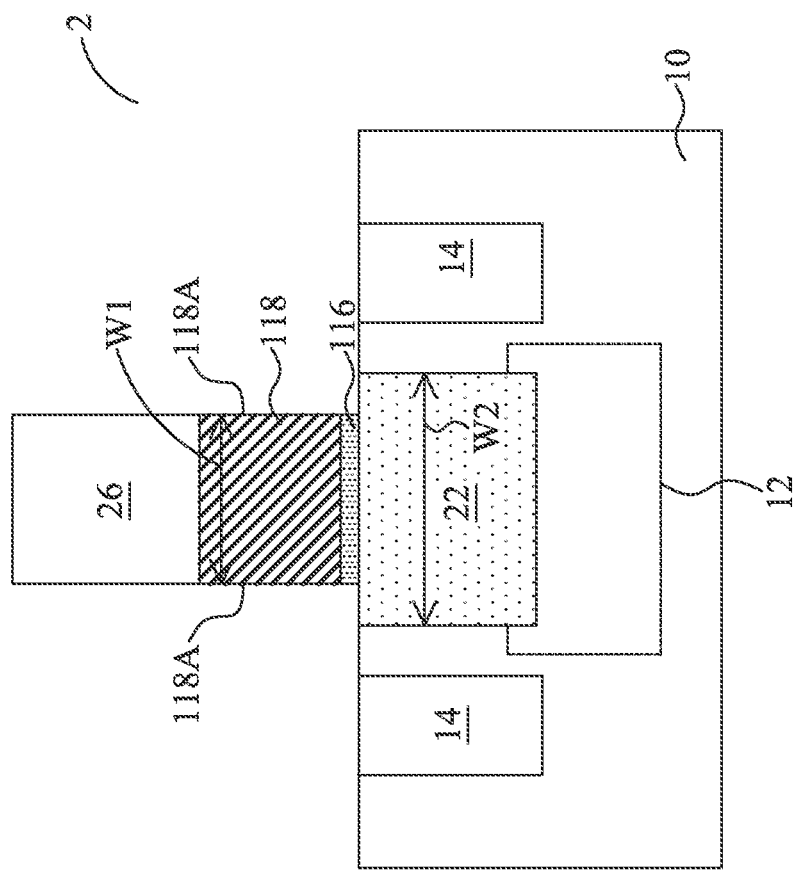
Figure 4B:
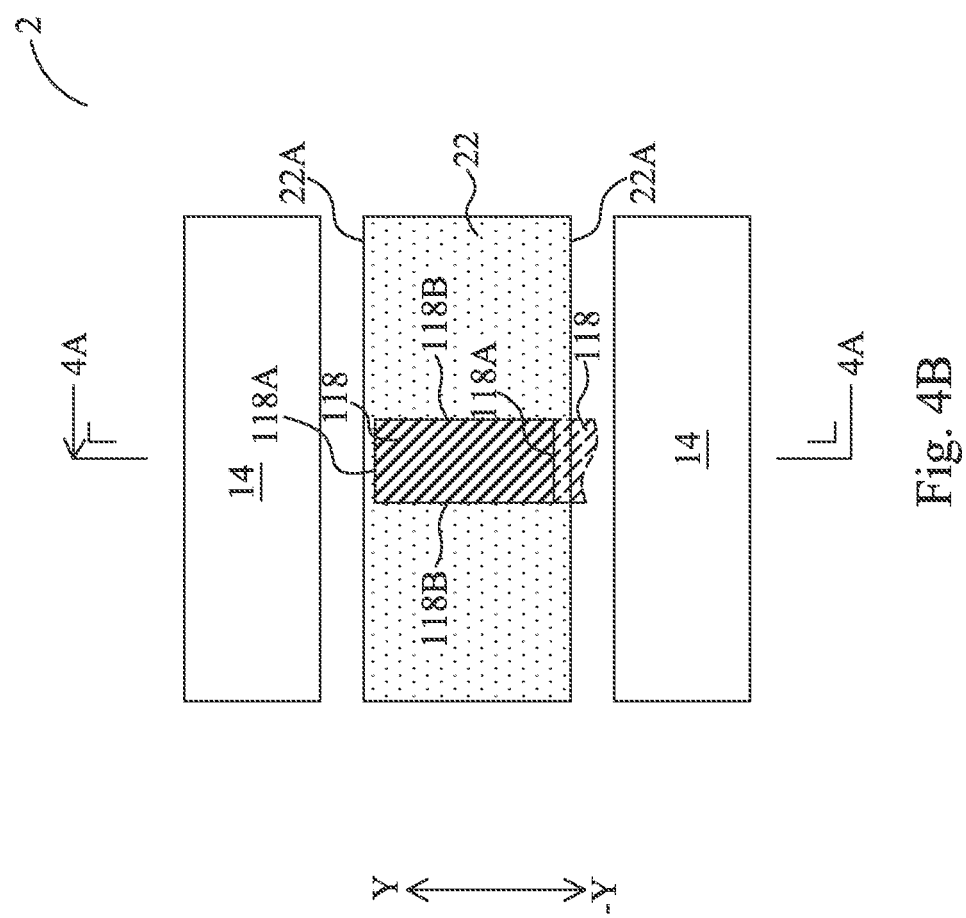

In FIG. 4A, photo resist 26 is formed and patterned. The patterned photo resist 26 includes a portion overlapping well region 22. A patterning step is then performed to remove the portions of gate electrode layer 18 that are uncovered by photo resist 26, so that gate electrode 118 is formed. Gate electrode layer 16 is also patterned to form gate electrode 116. In some embodiments, width W1 of gate electrode 118 is smaller than width W2 of well region 22. Furthermore, opposite edges 118A of gate electrode 118 may overlap well region 22 in accordance with some exemplary embodiments. A top view of the structure in FIG. 4A is illustrated in FIG. 4B, wherein the cross-sectional view in FIG. 4A is obtained from the plane crossing line 4A-4A in FIG. 4B. In accordance with some embodiments, as shown in FIG. 4B, an entirety of gate electrode 118 overlaps well region 22. In these embodiments, gate electrode 118 includes edges 118A parallel to each other, and edges 118B parallel to each other and perpendicular to edges 118A, wherein edges 118A and 118B overlap well region 22. In alternative embodiments, as shown by dashed lines, gate electrode 118 may extend beyond edges 22A of well region 22 in one or two directions (the illustrated +Y and/or −Y directions).

Figure 5A:
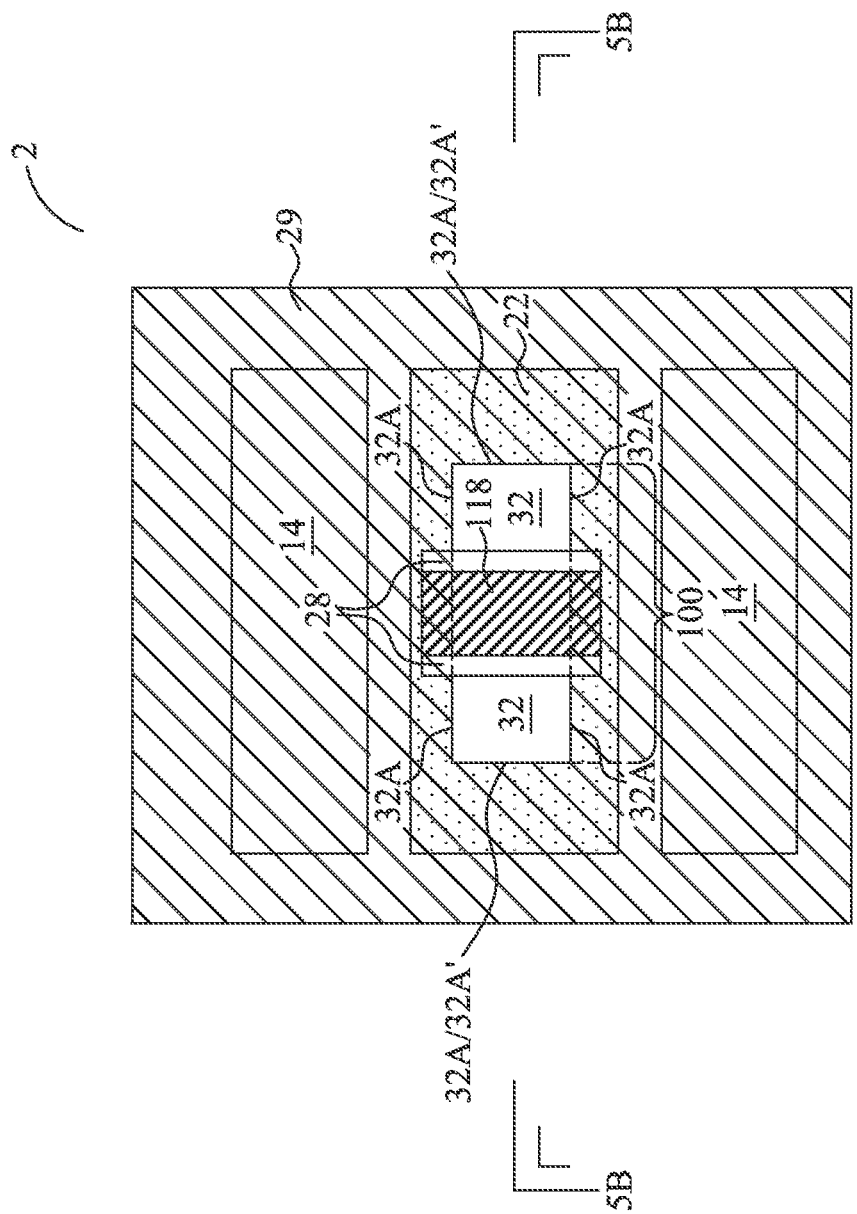
Figure 5B:
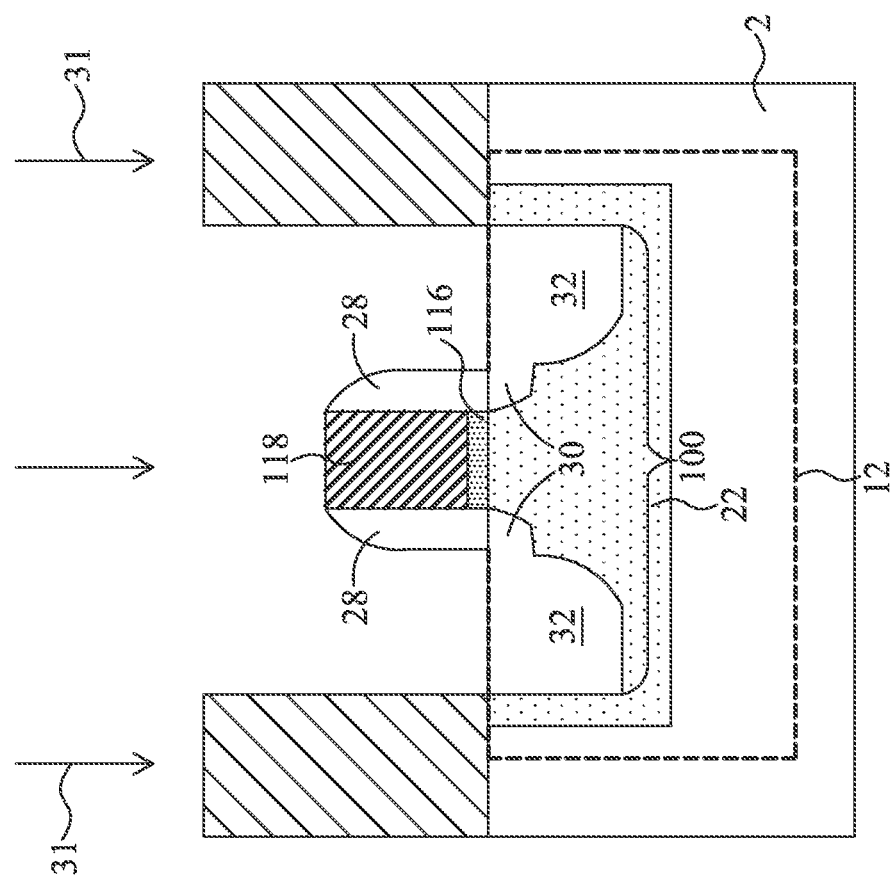

FIGS. 5A and 5B illustrate a top view and a cross-sectional view, respectively, in the formation of gate spacers 28 and source and drain regions 32 (alternatively referred to source/drain regions, or S/D) of MOS device 100. The cross-sectional view in FIG. 5B is obtained from the plane crossing line 5B-5B in FIG. 5A. FIG. 5A illustrates implantation mask 29 and the formation of source and drain regions 32. In some embodiments, implantation mask 29 is patterned to cover a central portion of gate electrode 118. Furthermore, the patterned implantation mask 29 covers edge portions of well region 22, and a central portion of well region 22 is not covered. The covered edge portions of well region 22 may form a ring encircling the uncovered central portion.

Source and drain regions 32 are formed by implanting an impurity that has a conductivity type opposite to the conductivity type of well region 22 and deep well region 12. Arrows 31 in FIG. 5B represent the source/drain implantation. For example, when well region 22 and deep well region 12 are p-type regions, source and drain regions 32 are n-type regions, and MOS device 100 is an NMOS device. Conversely, when well region 22 and deep well region 12 are n-type regions, source and drain regions 32 are p-type regions, and MOS device 100 is a PMOS device. Source and drain regions 32 may have a p-type or n-type impurity concentration between about $10^{19}/cm^3$ and about $5\times10^{21}/cm^3$. FIG. 5B also illustrates the formation of source and drain extension regions 30, which may be formed by an implantation step, which is performed before the formation of gate spacers 28 and after the patterning of gate electrode layer 18.

Figure 6:
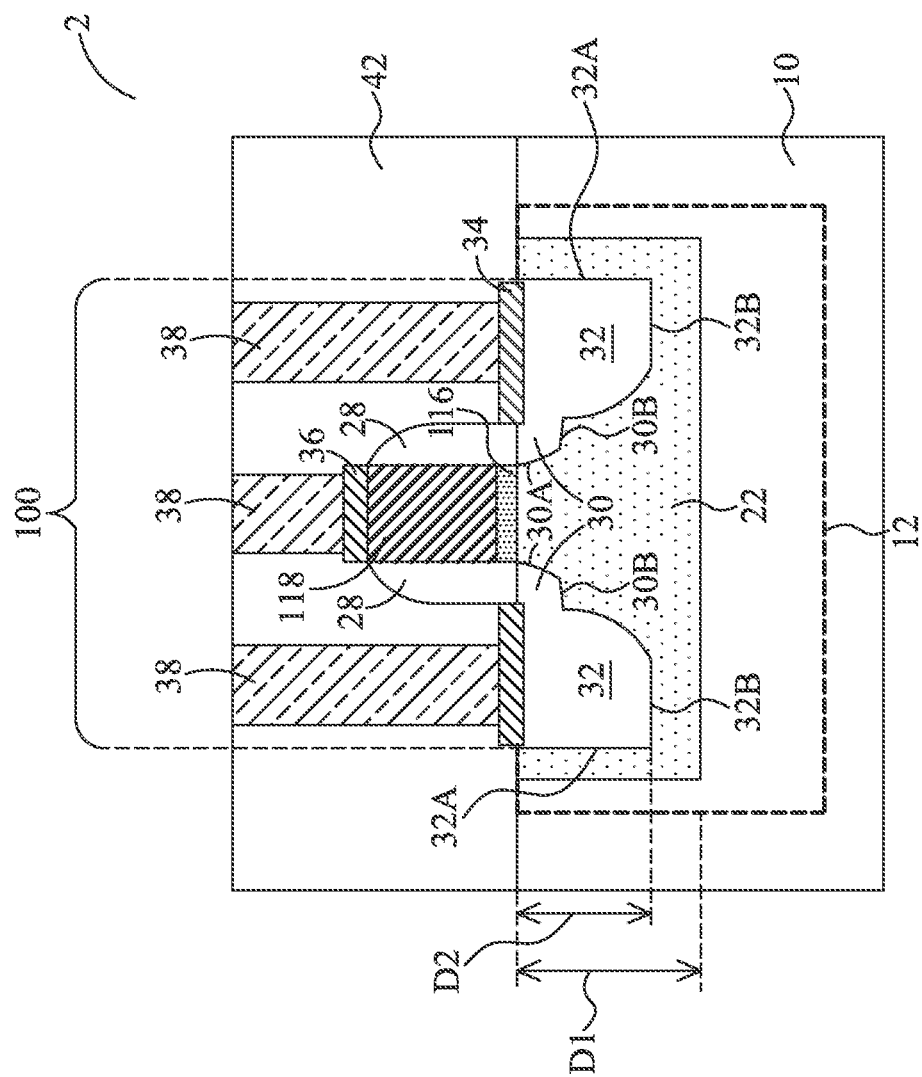

Referring to FIG. 6, the remaining portions of MOS device 100 are formed, which remaining portions include source and drain silicide regions 34, gate silicide region 36, Inter-Layer Dielectric (ILD) 42, and contact plugs 38. As shown in FIG. 6, depth D2 of source and drain regions 32 is smaller than depth D1 of well region 22. Accordingly, source and drain regions 32 and source and drain extension regions 30 are encircled by well region 22. The bottoms of source and drain regions 32 and source and drain extension regions 30 also contact the top surfaces of well region 22.

Since source and drain regions 32 and source and drain extension regions 30 have a conductivity type opposite to the conductivity type of well region 22, p-n junctions are formed at interfaces 32A, 32B, 30A, and 30B. The p-n junctions, which are also denoted using reference notations 32A and 32B, are formed between source and drain regions 32 and well region 22. Furthermore, additional p-n junctions, which are also denoted using reference notations 30A and 30B, are formed between source and drain extension regions 30 and well region 22. As shown in FIG. 5A, each of source/drain regions 32 may have three edges 32A contacting well region 22 to form junction isolations. Among the three edges 32A, two of edges 32A are opposite edges that are parallel to each other. The remaining one of the edges 32A, which is marked as 32A', is an outer edge since it faces away from gate electrode 118. The p-n junctions at edges 32A form junction isolations, which replace STI regions for isolating MOS device 100.

In the structure shown in FIG. 6, well region 22, different from STI regions, extends underlying gate dielectric 116 and gate electrode 118. Furthermore, well region 22 also extends underlying, and overlapped by, source and drain regions 32 and source and drain extension regions 30. The junction isolations 32A (FIGS. 5A and 6) are thus self-aligned to the boundaries of source and drain regions 32 and source and drain extension regions 30.

The structure shown in 5A through FIG. 6 may be used in the formation of Complementary Metal-Oxide-Semiconductor (CMOS) Image Sensor (CIS) chips, which include the image sensors 14 in FIG. 5 as the image sensors. The CIS chips may be either front-side illumination image sensor chips or Backside Illumination (BSI) image sensor chips.

Figure 7:
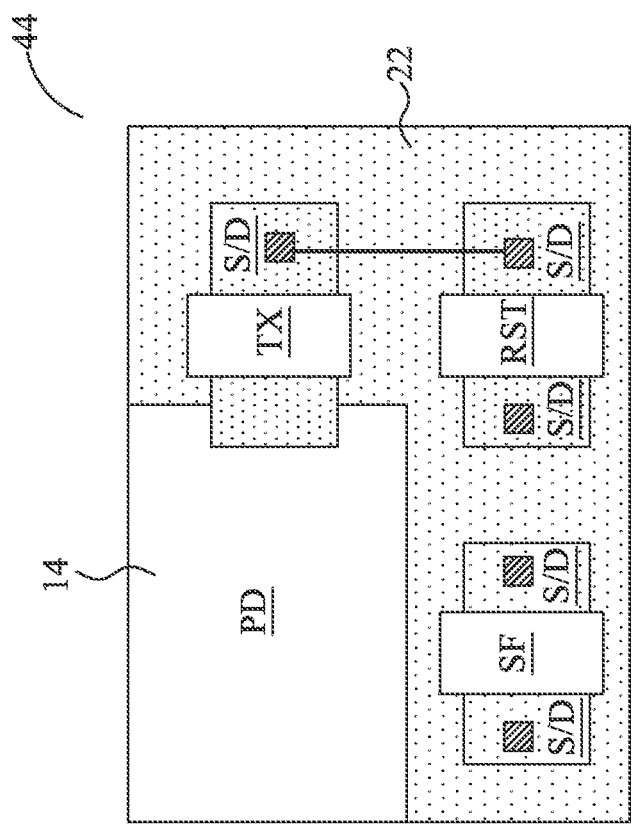
FIG. 7 illustrates a layout of an exemplary image sensor unit and the transistors in the image sensor unit, wherein the transistors and the image sensor may have the structure shown in FIG. 6.

FIG. 7 illustrates a layout of an exemplary image sensor unit 44 that is used in the CIS chips. Image sensor 14 includes one of image sensors 14 (which may be a photo diode, or PD), transfer gate transistor TX, reset transistor RST, and source follower SF. MOS device 100 in FIGS. 5A and 5B may be either source follower SF or reset transistor RST. Well region 22 is formed to adjoin, and may encircle, one or both of reset transistor RST and source follower SF.

Figure 8:
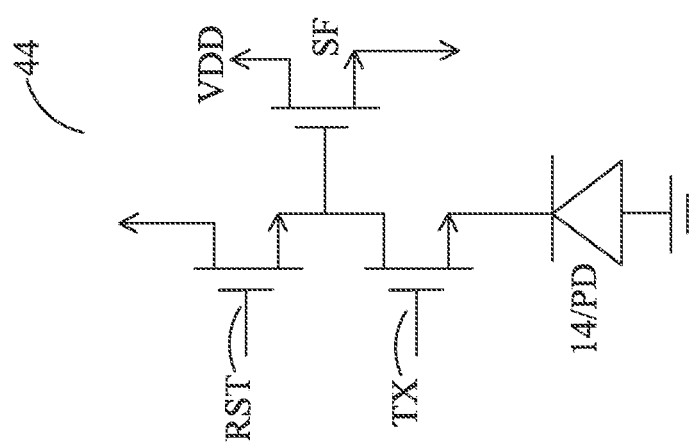
FIG. 8 illustrates a circuit diagram of the image sensor unit shown in FIG. 7.

FIG. 8 illustrates an exemplary circuit diagram of image sensor unit 44. The electrical connections between image sensor 14, transfer gate transistor TX, reset transistor RST, and source follower SF may be achieved, for example, through contact plugs (such as 38 in FIG. 6), metal lines, and vias (not shown), which may be formed after the formation of image sensor 14 and MOS device 100.

In the embodiments, junction isolations are formed for isolating MOS device 100. The formation of the junction isolations incurs less damage to semiconductor substrate 10 (FIG. 6) compared to the formation of the conventional STI regions. The source and drain regions of the MOS devices are self-aligned to the junction isolations. The self-aligned formation of the junction isolations may improve the accuracy in the process control.

In accordance with embodiments, a device includes a semiconductor substrate, a well region in the semiconductor substrate, and a MOS device. The MOS device includes a gate dielectric overlapping the well region, a gate electrode over the gate dielectric, and a source/drain region in the well region. The source/drain region and the well region are of opposite conductivity types. An edge of the first source drain region facing away from the gate electrode is in contact with the well region to form a junction isolation.

In accordance with other embodiments, a device includes a semiconductor substrate, a well region in the semiconductor substrate, and a MOS device. The MOS device includes a gate dielectric overlapping the well region, a gate electrode over the gate dielectric, and a source region and a drain region in the well region. The well region is in contact with edges and bottoms of the source and drain regions to form p-n junctions. The well region encircles the source and drain regions. The device further includes an image sensor electrically coupled to the MOS device.

In accordance with yet other embodiments, a method includes implanting a semiconductor substrate to form a well region in the semiconductor substrate, wherein the well region is of a first conductivity type, and forming a MOS device. The formation of the MOS device includes forming a gate electrode overlapping a first portion of the well region, and forming an implantation mask over the well region and the gate electrode. A second portion of the well region is underlying an opening in the implantation mask. A third portion of the well region is covered by the implantation mask, wherein the third portion encircles the first portion and the second portion. The formation of the MOS device further includes implanting the second portion of the well region through the implantation mask to form a source/drain region in the well region, wherein an edge of the source/drain region facing away from the gate electrode is in contact with the well region. An impurity implanted during the step of implanting has a second conductivity type opposite the first conductivity type.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a semiconductor substrate;
   a well region in the semiconductor substrate;
   a Metal-Oxide-Semiconductor (MOS) device comprising:
      a gate dielectric overlapping the well region;
      a gate electrode over the gate dielectric; and
      a first source/drain region in the well region, wherein the first source/drain region and the well region are of opposite conductivity types, and wherein an edge of the first source/drain region facing away from the gate electrode contacts the well region to form a junction isolation;
   a first photo diode adjacent to the MOS device and in the semiconductor substrate, wherein the well region comprises a first edge in contact with an edge of the first photo diode; and
   a second photo diode adjacent to the MOS device and in the semiconductor substrate, wherein the well region comprises a second edge in contact with an edge of the second photo diode.

2. The device of claim 1, wherein three side edges of the first source/drain region and bottom surfaces of the first source/drain region are in contact with the well region.

3. The device of claim 1 further comprising a second source/drain region in the well region, wherein edges of the second source/drain region are in contact with the well region.

4. The device of claim 1, wherein the portion of the semiconductor substrate between the first photo diode and the first source/drain region is free from dielectric isolation regions therein.

5. The device of claim 1, wherein the portion of the semiconductor substrate between the first photo diode and the first source/drain region is a doped semiconductor region of a same conductivity type as the well region, and wherein the portion of the semiconductor substrate has an impurity concentration lower than an impurity concentration of the well region.

6. The device of claim 1, wherein the MOS device and the first photo diode are electrically coupled to each other, and form portions of an image sensor unit, and wherein the MOS device is a reset transistor of the image sensor unit.

7. A device comprising:
   a semiconductor substrate;
   a well region in the semiconductor substrate, wherein the well region comprises a first edge and a second edge opposite to the first edge;
   a Metal-Oxide-Semiconductor (MOS) device comprising:
      a gate dielectric overlapping the well region;
      a gate electrode over the gate dielectric; and
      a source region and a drain region in the well region, wherein the well region is in contact with edges and bottoms of the source and drain regions to form p-n junctions, and wherein the well region encircles the source and drain regions, wherein the MOS device is a reset transistor of an image sensor unit;
   a first image sensor electrically coupled to the MOS device, wherein the first image sensor contacts the first edge of the well region; and
   a second image sensor contacting the second edge of the well region.

8. The device of claim 7, wherein the gate electrode comprises:
   a first and a second edge parallel to each other; and
   a third and a fourth edge parallel to each other and perpendicular to the first and the second edges, and wherein the first, the second, the third, and the fourth edges overlap the well region.

9. The device of claim 7, wherein each of the source and drain regions comprises three edges contacting the well region to form junction isolations.

10. The device of claim 7, wherein an entirety of the portion of the semiconductor substrate between the first image sensor and both of the source and drain regions is free from dielectric isolation regions therein.

11. The device of claim 7, wherein the MOS device and the first image sensor are electrically coupled to each other, and form parts of an image sensor unit.

12. The device of claim 7 further comprising a deep well region underlying the well region, wherein the deep well region and the well region are of a same conductivity type, and the deep well region has an impurity concentration lower than an impurity concentration of the well region.

13. A device comprising:
a semiconductor substrate;
a well region in the semiconductor substrate, wherein the well region is of a first conductivity type;
a Metal-Oxide-Semiconductor (MOS) device comprising:
  a gate dielectric overlapping the well region;
  a gate electrode over the gate dielectric; and
  a source region and a drain region in the well region, with the source region and the drain region being of a second conductivity type opposite to the first conductivity type wherein the source region, the drain region, and a portion of the semiconductor substrate between the source region and the drain region in combination are fully encircled by the well region; and
a first and a second photo diode in the semiconductor substrate, wherein the well region comprises a first edge and a second edge opposite to each other, with the first edge contacting the first photo diode, and the second edge contacting the second photo diode.

14. The device of claim 13, wherein the well region comprises a lower portion and an upper portion overlapping and joined to the lower portion, and the upper portion is narrower than the lower portion.

15. The device of claim 13 further comprising a transfer gate transistor, a reset transistor, and a source follower, with the transfer gate transistor, the reset transistor, and the source follower being comprised in a same image sensor unit as the first photo diode.

16. The device of claim 13, wherein no dielectric isolation region is in contact with the well region, the source region, and the drain region.

17. The device of claim 15, wherein the MOS device is the reset transistor of the image sensor unit.

18. The device of claim 7, wherein the first image sensor comprises a photo diode, and an edge of the well region is in physical contact with an edge of the photo diode.

19. The device of claim 1, wherein the first edge and the second edge are opposite edges of the well region.

20. The device of claim 1, wherein the first source/drain region is fully encircled by a portion of the well region.

* * * * *